United States Patent [19]

Weresch

[11] Patent Number: 4,642,159

[45] Date of Patent: Feb. 10, 1987

[54] APPARATUS FOR LINING UP ELECTRICAL COMPONENTS TO FORM A BELT

[76] Inventor: Thomas Weresch, Greschbachstrasse 19, D-7500 Karlsruhe 41, Fed. Rep. of Germany

[21] Appl. No.: 666,308

[22] Filed: Oct. 30, 1984

[30] Foreign Application Priority Data

Dec. 24, 1983 [DE] Fed. Rep. of Germany ....... 3346997

[51] Int. Cl.$^4$ .................. B32B 31/10; B32B 31/18
[52] U.S. Cl. .................. 156/510; 156/552; 53/591; 140/139; 140/140
[58] Field of Search .............. 156/250, 267, 510, 552, 156/567, 568; 53/591; 140/139, 140; 206/328, 330, 331

[56] References Cited

U.S. PATENT DOCUMENTS

| 4,021,292 | 5/1977 | Bates et al. | 156/552 |
| 4,279,278 | 7/1981 | Weresch | 156/552 |
| 4,311,544 | 1/1982 | Salopek et al. | 156/552 |

Primary Examiner—Caleb Weston
Attorney, Agent, or Firm—Antonelli, Terry & Wands

[57] ABSTRACT

An apparatus for aligning electrical components with aligned connecting wires to form a belt between two adhesive tapes, the apparatus including a compact working member provided with a guidance and alignment arrangement for the second adhesive tape, (a) pressing device and a cutting device for cutting the connecting wires of the components. A pressing roll of the pressing device is rotatable, but rigidly mounted. Axially parallel grooves are provided in a circumferential surface of the roller, with the grooves being aligned with tooth gaps of the conveying gear wheels, thereby ensuring a better wrapping around of the connecting wires.

8 Claims, 2 Drawing Figures

APPARATUS FOR LINING UP ELECTRICAL COMPONENTS TO FORM A BELT

BACKGROUND OF THE INVENTION

The invention relates to an apparatus for aligning electrical components with two aligned connecting wires to form a belt, wherein two adhesive tapes respectively drawn from a delivery spool, secure the connecting wires between them, with two rotary drivable conveying gear wheels arranged on a shaft and receiving the connecting wires in tooth gaps, with two rollers arranged on the shaft, each guiding one of the adhesive tapes and with pressing means in each case pressing the second adhesive tape in congruent manner on the first adhesive tape whilst incorporating the connecting wires.

Apparatus for aligning electrical components with two aligned connecting wires or belting or binding means are described, for example, German Pat. No. 2,618,383 and DOS 2,813,100 the details of which are incorporated herein by reference. More particularly, with regards to constructional details of the overall machine, to the extent that corresponding developments are not described in the present application and particularly to the extent that not diverging developments are described herein. The known belting means have a casing with a drive and optionally a gear, by which the spacings of the components can be differently adjusted on the belt to be produced. A driven shaft projects out of the casing and on it are mounted the conveying gear wheels and rollers in a non-rotary manner. The tooth gaps of the conveying gear wheels receive the connecting wires and the components are held and conveyed in this manner. A first adhesive tape is placed around each of the rollers, with an adhesive surface thereof being directed towards the outside. After placing the components in the conveying gear wheels, part of the wires of the components rest on the adhesive surface of the adhesive tape. Then, for as long as the components are guided by the conveying gearwheels and the connecting wires rest on rollers, a further adhesive tape is guided over the areas of the connecting wires resting on the rollers and under the action of an elastic force, such as an elastically mounted pressing roll, is pressed against the connecting wires and the areas of the lower adhesive tape located between said wires. Optionally, as proposed in DOS 2,813,100 the connecting wires of the components are straightened before being placed in the conveying gear wheels. The completely belted components are then wound as a finished belt onto a draw-off roll.

The above proposed apparatus function in a largely satisfactory manner. However, the connecting wires of the components can have a different length, so that they project to a varying degree beyond the belts. It is also desired that the belted components have connecting wires of specific predetermined lengths. It would theoretically be possible to provide separate cutting means which deflect the connecting wires upstream or preferably downstream of the belt. However, this is complicated and experiments have shown that the belted components are not adequately secured between the belts, so that particularly when cutting is effected, displacement thereof occurs, or the connecting wires may slide out between the belts. Moreover, in the proposed belting machines, the pressing means is constructionally complex, which complicates the adjustment of the axial spacing.

Therefore, the aim underlying the present invention essentially resides in providing an apparatus of the aforementioned type in which constructionally simple means are provided for the actual belting operation, and which permits an easier adjustability and also a better support of the belted components between the adhesive tapes. According to the invention, each roller is associated with a compact working member, which has guidance and alignment means for the second adhesive tape, the pressing means and a cutting means for cutting off the connecting wires of the components.

The compact working member provided according to the invention and which, as stated above, includes means for performing several functions, but is of a simple construction and permits an easier adjustment. For example, in a known manner, following the release of an attachment for the working member, the latter can be adjusted at the same time as the rollers. The axial adjustment of the apparatus according to the invention takes place more simply than in the case of known apparatus. Moreover, through the construction of a cutting means in or on the working member, it is possible to achieve a deflection of the connecting wires to their desired length when the wires are in any case under a maximum pressure for belting purposes, so that there is no need for a subsequent cutting with the resulting problems with respect to the individual components having to be released from the belt. Due to the fact that the guidance means is constructed in the actual working member and, consequently, necessarily upstream of the roller and the pressing means or up to the latter, it has a relatively simple construction, so that complicated guidance means, as used in the prior art, are no longer necessary.

According to the present invention, the working member is constructed as a compact block having a guide groove for the second adhesive tape and a pressing roll mounted therein which is axially displacable relative thereto and radially overlapping the same, with the guide groove being aligned over the pressing roll, and with the pressing roll, resting on the roller and the cutting roll, being positioned directly adjacent the roller and radially overlapping the same, so that the circumferential edge of the roller cooperates as a cutting edge with the cutting roll. Due to the construction of a guide groove formed with the roller in the radial direction within the working member in the form of a compact block, there is no need for guidance means in the conveying direction and upstream of the guide groove, which precisely guide the adhesive tapes. In fact, unlike in the prior art, the adhesive tapes can be deflected or guided in a random manner, with considerable tolerances with respect to a lateral displacement of the running path of the adhesive tapes, with the path not being precisely prescribed. With the inventive construction of the guide groove in the working member, it would appear desirable, particularly if the adhesive tapes are guided on their conveying path from their delivery spool to the guide groove, to provide means over which the adhesive tapes are guided, on which the tapes can relatively freely move at right angles to their conveying direction, so that they largely automatically select their conveying path with respect to a lateral displacement and can consequently optimize the same. Thus, the invention permits a preferred construction in that adhesive tape guides are provided in the conveying direction upstream of the working member and/or the roller, with the adhesive tape guides being of a fixed width projecting by a multiple over the width of the adhesive tapes and with the tape guide including radially elastically outwardly pressed cutting edges. This construction makes it possible to eliminate electro optical limit switches with complicated electronics. The end of an adhesive tape or a fault through slackening of the exerted tension can be determined by the elastically mounted cutting edge, which is connected to a switch and, consequently, in the case of a fault, the apparatus according to the invention can be stopped, so that no serious damage occurs.

According to further features of the present invention, the circumferential edge of the cutting roll in the contact line of the pressing roll and roller intersects the circumferential cylinders thereof and in particular the tangent on the cutting roll extends vertically in the contact line to the tangential planes of roller and pressing roll. As a result, in the case of maximum pressure, the contact wires are cut off, with the edge of the roller acting as a second cutting edge associated with the cutting edge of the cutting roll. In accordance with advantageous features of the present invention, the cutting takes place in such a way that, through cutting the connection wires, no force is exerted in or counter to the feed direction, but merely at right angles thereto. This is particularly aided by the fact that the pressing roll is rotatable, but otherwise rigidly mounted and that in the circumference of the roller axially parallel grooves are formed, which are aligned with the tooth gaps of the conveying gear wheels. Due to the construction of grooves, the connecting wires, which are initially placed on the adhesive tapes stretched over the grooves, can be pressed with the first adhesive tapes into the grooves and, consequently, the first adhesive tapes wind around them in an optimum manner, which gives an optimum support together with the placed-over and pressed-down second adhesive tape. Both in areas of the belt in which connecting wires are arranged between both adhesive tapes, and on areas between the connecting wires where the adhesive tapes are directly stuck to one another, advantageously substantially the same contact pressure is exerted for producing the bond, so that, it is not possible that as a result of an adequate contact pressure, no reliable bond is achieved between the adhesive tapes, as in the prior art, because it is then necessary to allow the pressing members to elastically yield in accordance with the height of the components. The pressing rolls are preferably made from an elastic material and, in particular a hard elastic plastic material which, although able to absorb slight tolerances, is not so soft that it can be dented over long periods of time without a great force being exerted thereon. Moreover, by virtue of the present invention, there is no longer any need for an elastic mounting of the pressing rolls, so that the complete working member can be firmly pressed with the pressing roll against the roller during adjustment and can be secured or fixed in this position. The formation of grooves in the roller also makes it possible, in advantageous manner, to obtain a forced fixing of the spacing of the individual components and it is obviously possible to leave certain grooves free, instead of placing the components in each of the succeeding grooves. Adjustment may be accomplished by a stepping motor, with the step size and the presence of the components at the belting point being monitorable by light monitors, which, in particular, stop the belting process when there are no components, so that belting only takes place when there are components. This leads to a considerable advantage compared with mechanical gears, which continue to belt if no components are present.

The above and other features will become more apparent from the following description when taken in connection with the accompanying drawings.

DETAILED DESCRIPTION OF THE INVENTION

It is pointed out that apparatuses of the present type for aligning electrical components are described in detail in German Pat. No. 2,618,383 and DOS 2,813,100. The above proposed constructions form a basis for the present application, unless express differences are stressed and described. This applies particularly regarding the supply of the components, the drive, the mounting of the individual shafts and a possible stretching or alignment of the connecting wires of the components. This does not apply with regards to the differently constructed guide system and the pressing of the adhesive tapes, the cutting of the connecting wires and the mounting of the connecting wires on the rollers and a detailed description will be provided thereon hereinafter.

Figure 1:
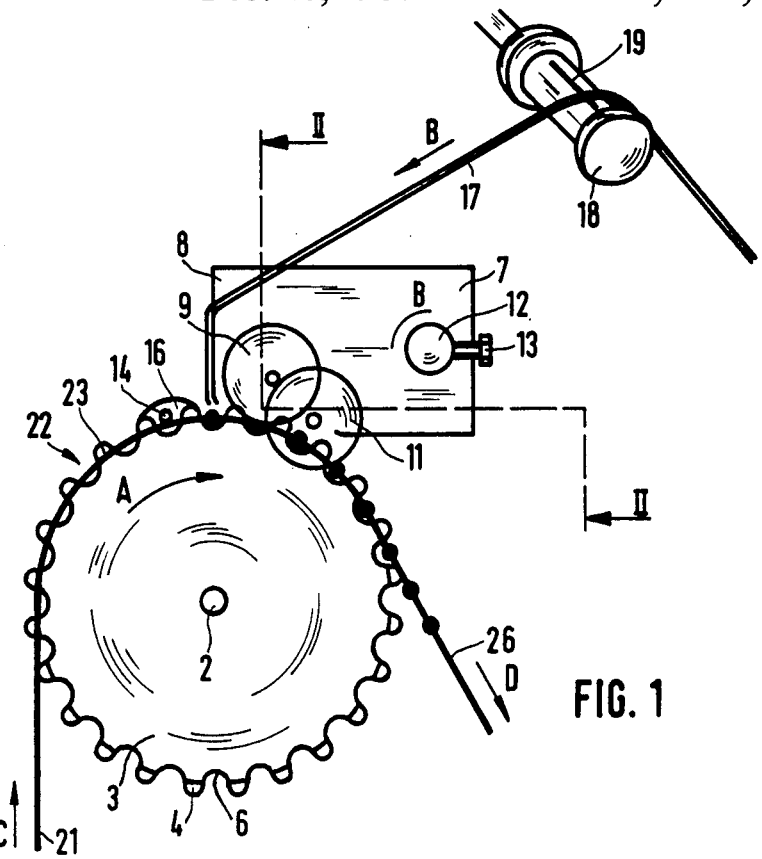
FIG. 1 a side view of portions of the apparatus according to the invention.

A drive shaft 2 projects out of a casing 1 and is connected to a stepping motor 1', with two conveying gear wheels 3 and two rollers 4 being non-rotatably but axially adjustable and fixable in a desired position along the shaft 2. Each conveying gear wheel 3 can optionally be arranged with a relative spacing with respect to the particular roller 4. It is also possible to provide further, in a manner not shown, conveying gear wheels adjustable separately from rollers 4 in accordance with the length of the components. In this case, the conveying gear wheel 3 and the associated roller 4 are constructed as one part and are consequently only jointly adjustable and, as shown in the drawings, rest upon one another in the axial direction. The circumference of the roller 4 is provided with grooves 6, to which further reference will be made hereinafter. A working member 7 is provided above the rollers 4, with the working member 7 being formed as a compact block, and with FIG. 2 only showing working member 7 on the right-hand side. Working member 7 is not positioned precisely above roller 4 but is displaced somewhat with respect thereto in the rotation direction A. A sloping groove 8 is formed in a top surface of working member 7 above roller 3, with width of the sloping groove essentially corresponding to that of the tapes to be bonded or the width of the rollers 4. In the area of the lower part of the working member 7 a pressing roll 9 is precisely aligned with the groove 6 and is rotatable, but radially fixed in the working member 7 and is preferably made from a hard elastic plastic material. The pressing roll 9 is positioned precisely radially over the associated roller 4 and rests thereon. A cutting roll 11 is positioned laterally of pressing roll 9, but is relatively displaced with respect thereto in the working member 7. The circumference of cutting roll 11, as shown in FIG. 1, radially overlaps both pressing roll 9 and roller 4. In a preferred manner, the cutting roll 11 intersects an imaginary cylinder corresponding to the circumference of the roller 4 and the pressing roll 9 in the contact line of the pressing roll 9 and roller 4 or corresponding to the axially extended circumferential cylinder of both of them. Preferably, a tangent of the circumference of cutting roll 11 in the contact point of roller 3 and pressing roll 9 is at right angles to their common tangent.

The working member 7 is pivotably mounted about a spindle 12 and is fixable in a performed pivoting position by means of a clamping device 13, e.g. a pressing screw. Preferably, the working member 7 is pivoted as far as possible in the direction of the arrow B and, consequently, the pressing roll 9 is pressed firmly onto roller 4. Such a non-elastic pressing of the working member 7 is only possible as a result of the grooves 6 in roller 4, because the connecting wires 14 of electrical component 16 are received in the grooves 6. If roller 4 had a smooth surface, the connecting wires 14 would rest on its circumference and the pressing roll 9 which must also compress two adhesive tapes between the components, would have to be able to give way in the vicinity of the connecting wires, which is not the case with the present mounting system. Due to the fact that a guidance means in the form of groove 8 in the working member 7 is provided immediately adjacent to roller 4 and aligned therewith there is no longer any need for an exact guidance of the adhesive tape 17 supplied through groove 8 upstream of the latter. This avoids the need for further complicated guidance means for adhesive tape 17, as required with the prior art. There is also no need for adhesive tape 17 to be guided from a delivery spool (not shown) in the plane determined by rollers 4 and can instead be deflected and guided in a largely random manner. In order to permit a good insertion of the adhesive tape 17 in the groove 8 without complicated guidance means and also in the case of deflection, guide or return rollers 18 are arranged at a certain distance from the working member 7 and have an axial length significantly exceeding the width of adhesive tape 17 and are bounded by raised annular shoulders at their axial ends. The guide rollers 18 can be adjusted in many different ways. The adhesive tape 17, sliding over such a guide roller 18 and deflected or guided by the same can be adjusted and moved in an optimum manner along the axial length of guide roller 18 as a result thereof, so that it is cleanly inserted in groove 8 independently of the deflection or guidance circumstances. An elastically mounted cutting edge 19 is inserted in the circumference of the roller 18 with the adhesive tape 17 running over the cutting edge 19 and presses the cutting edge 19 into the roller circumference under tension. If the tension is relieved or the adhesive tape ends, the cutting edge 19 is elastically pressed out of the circumference of roller 18. However, cutting edge 19 is connected to an electric switch. If as a result of a terminating adhesive tape or a relieving of the tension from the necessary tension occurs, the cutting edge 19 moves beyond the outer circumference of roller 18, so that the operation of the apparatus is interrupted thereby avoiding the occurrence of faults. Due to the construction of the cutting edge 19 as a mechanical limit switch, complicated electro optical means for determining the end of an adhesive tape and an exact guidance of the adhesive tape 17 are rendered unnecessary.

Figure 2:
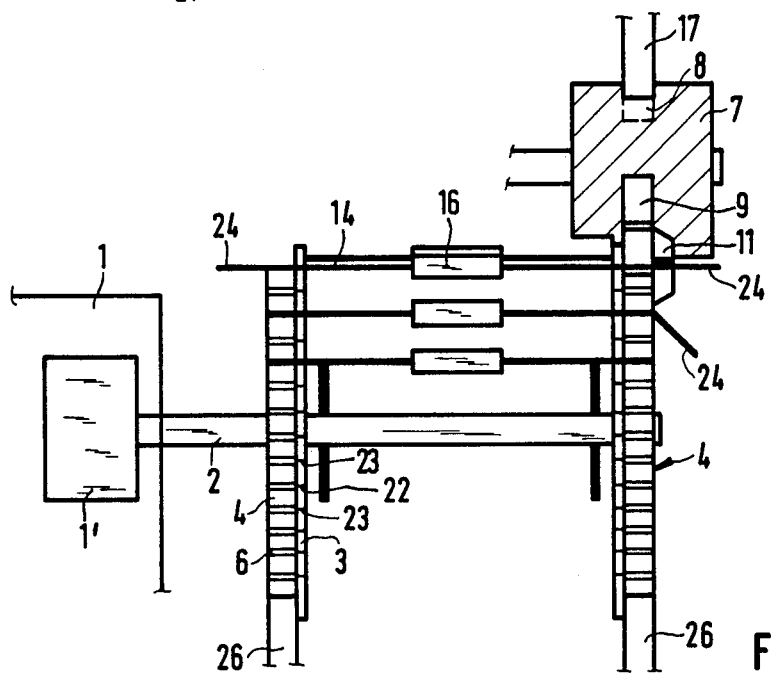
FIG. 2 a view taken along the line II—II of a left-hand side of the apparatus of FIG. 1.

A first adhesive tape 21 is supplied from the bottom to the left-hand side of roller 3 and is placed on its circumference, the arrangement in FIGS. 1 and 2 being similar to that in the aforementioned publications. The adhesion side of adhesive tape 21 is to the outside and directed away from roller 3. In the upper area of roller 4 and conveying gear wheels 3, a component 16 with connecting wires 14 are supplied in the manner described in the aforementioned publications (particularly DOS 2,813,100), inserted in tooth gaps 22 between two teeth of gear wheel 3 and is held between corresponding teeth 23. Adhesive tape 21 is stretched over roller 3 and the connecting wires 14 rest on the adhesive tape 21. In the rotation direction A behind the feed position from the components, the further adhesive tape 17 is guided by guide roller 18 through the guide groove 8 of the working member 7 over the roller 4 between the same and pressing roll 9. The latter presses the connecting wire 14, which is initially held between two teeth 23 in a tooth gap 22, together with the part of adhesive tape 21 located between the same and the roller circumference into a groove 6 of roller 4 to a deep level therein. The adhesive tape 21 is wrapped around the component connecting wire 14 over a large proportion of its circumference and adheres thereto. The upper adhesive tape 17 supplied below pressing roll 9 is pressed onto the free area of connecting wire 14 around which adhesive tape 21 is not wrapped and is adhesively secured thereto. Upstream and downstream of the connecting wire 14, the two adhesive tapes are firmly bonded together under the pressure of roll 9. At the point where the pressing roll 9 exerts the maximum contact pressure on the adhesive tapes 17, 21 and connecting wire 14, connecting wire portions 24 projecting axially over roller 4 are cut off and dropped. Due to the fact that the cutting process takes place precisely when the connecting wire 14 is pressed in optimum manner by the pressing roll 9 into the corresponding groove 6 of roller 4 due to the relative arrangement of pressing roll 9, roller 4 and cutting roll 11, the connecting wire 14 is simultaneously held during cutting and the cutting roll 11 cannot give way. During cutting, the adjacent circumferential edges of cutting roll 11 cooperate with roller 4 as cutting edges. Following the cutting to length of their connecting wires 14, the belted components are conveyed to a winding spool (not shown) for belts 26, in accordance in the direction of arrow D.

As a result of the construction according to the invention, improvements are achieved with respect to constructional simplicity thereby reducing production costs costs and providing a more reliable belting of components, i.e. a firmer adhesion of the connecting wires and the adhesive tapes, as well as a reliable, accurate cutting of projecting parts precisely at the lateral edges of the adhesive tapes.

While I have shown and described only one embodiment in accordance with the present invention, it is understood that the same is not limited thereto but is susceptible to numerous changes and modifications as known to one having ordinary skill in the art and I therefore do not with to be limited to the details shown and described herein but intend to cover all such modifications as are encompassed by the scope of the appended claims.

I claim:

1. An apparatus for aligning electrical components with two aligned connecting wires to form a belt, wherein first and second adhesive tapes, drawn from a separate delivery spool are secured to the aligned connecting wires, the apparatus including two rotary drivable conveying gear wheels arranged on a shaft and adapted to receive the connecting wires in tooth means formed therein, two rollers are arranged on the shaft, each of said rollers being adapted to guide one of the adhesive tapes, pressing means for pressing the second adhesive tape in a congruent manner on the first adhesive tape while incorporating the connecting wires, and a compact working means associated with each of said rollers, said compact working means including guidance and alignment means for the second adhesive tape, the pressing means and a cutting means for cutting off the connecting wires of the electrical components.

2. An apparatus according to claim 1, wherein each of the working means includes a compact block member, said guidance and alignment means includes a guide groove for the second adhesive tape, the pressing means includes a pressing roll mounted in said guide groove axially displacable relative thereto and radially overlapping the same, the guide groove is arranged in an aligned manner over the pressing roll, the pressing roll rests on an associated roller, and the cutting means includes a cutting roll positioned directly alongside the roller and radially overlapping the same, so that a circumferential edge of the roller cooperates as a cutting edge with the cutting roll.

3. An apparatus according to claim 2, wherein the circumferential edge of the cutting roll along a contact line of the pressing roll and roller intersects their circumferential cylinder.

4. An apparatus according to claim 3, wherein a tangent of the circumference of the cutting roll extends at right angles in the contact line to tangential planes of the roller and pressing roll.

5. An apparatus according to one of claims 2 to 4, wherein, although the pressing roll is rotatable, the pressing roll is otherwise rigidly mounted and, wherein axially parallel grooves are formed in a circumferential surface of the rolls, said axially parallel grooves are aligned with the tooth means of the conveying gear wheels.

6. An apparatus according to one of claims 1–4 wherein the working means is pivotable about a spindle and is adapted to be fixed in a desired pivoted position.

7. An apparatus according to one of claims 1–4, wherein adhesive tape guide means are disposed upstream of at least one of the working means and the roller, said adhesive tape guide means have a fixed width in excess of a width of the adhesive tapes by a multiple, and wherein radially elastically outwardly pressed cutting edges are provided in a circumferential surface of said adhesive tape guide means.

8. Apparatus according to claim 5, wherein an adjustable stepping motor with a stepping width adapted to the spacings of the roller grooves is provided as a drive for the roller.

* * * * *